United States Patent
Borkar et al.

(10) Patent No.: US 6,538,584 B2
(45) Date of Patent: Mar. 25, 2003

(54) TRANSITION REDUCTION ENCODER USING CURRENT AND LAST BIT SETS

(75) Inventors: Shekhar Y. Borkar, Beaverton, OR (US); Matthew B. Haycock, Beaverton, OR (US); Stephen R. Mooney, Beaverton, OR (US); Aaron K. Martin, Hillsboro, OR (US); Joseph T. Kennedy, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/752,883

(22) Filed: Dec. 28, 2000

(65) Prior Publication Data

US 2002/0130794 A1 Sep. 19, 2002

(51) Int. Cl.$^7$ ............................................. H03M 7/00
(52) U.S. Cl. .......................................... 341/58; 341/55
(58) Field of Search ...................... 341/58, 59

(56) References Cited

U.S. PATENT DOCUMENTS

| | | | |
|---|---|---|---|
| 3,828,346 A | * 8/1974 | Forster et al. | ................ 341/58 |
| 4,387,364 A | * 6/1983 | Shirota | ......................... 341/59 |
| 4,394,641 A | * 7/1983 | Ratigalas | ..................... 341/58 |
| 4,667,337 A | * 5/1987 | Fletcher | ....................... 377/41 |
| 5,604,450 A | 2/1997 | Borkar et al. | |
| 6,046,943 A | * 4/2000 | Walker | ................. 365/189.05 |

FOREIGN PATENT DOCUMENTS

WO    WO 00/18009    3/2000

OTHER PUBLICATIONS

Stan et al., *Bus–Invert Coding for Low–Poser I/O,* IEEE Transactions on VLSI Systems, vol. 3, No. 1, Mar. 1995, pp. 49–58.*

Nakamura et al. *A 500–MHz 4–Mb CMOS Pipeline–Burst Cache SRAM with Point–to–Point Noise Reduction Coding I/O,* IEEE Journal of Solid–State Circuits, vol. 32 No. 11, Nov. 1997, pp. 1758–1765.*

Benini et al. in the article *Architectures and Synthesis Algorithms for Power–Efficient Bus Interfaces,* IEEE Transactions on Computer Aided of Integrated Circuits and Systems, vol. 19, No. 9, Sep. 2000, pp. 969–980.*

Ramprasad et al. *A Coding Framework for Low–Power Address and Data Busses,* IEEE Transactions on Very Large Scale Integration (VLSI) Systems, vol. 7 No. 2, Jun. 1999, pp. 212–221.*

T. Gabara, "Digitally Adjustable Resistors in CMOS for High–Performance Applications,"IEEE Journal of Solid-State Circuits, vol. 27, No. 8, Aug. 8, 1992, pp. 1176–1185.

R. Farad–Rad, "A. 0.4–um CMOS 10–Gb/s 4–PAM Pre-Emphasis Serial Link Transmitter," IEEE Journal of Solid–State Circuits, vol. 34, No. 5, May 1999, pp. 580–585.

C. Smythe, "ISO 8802/5 token ring local–area networks," Electronics and Communication Engineering Journal, Aug. 1999, pp. 195–207.

T. Starr, "Understanding digital Subscriber Line Technology," Chapter 7, pp. 202–205, Prentice Hall PTR, Upper Saddle River, NJ, 1999.

* cited by examiner

Primary Examiner—Howard L. Williams
(74) Attorney, Agent, or Firm—Alan K. Aldous

(57) ABSTRACT

In some embodiments, the invention involves a circuit including a first set of conductors to carry a current bit set and last bit set circuitry to hold and provide a last bit set. The circuit also includes drivers coupled to interconnect conductors to provide signals from the drivers to the interconnect conductors and an encoder to receive the last bit set and the current bit set and determine whether to provide the current bit set or an encoded version of the current bit set to the drivers.

22 Claims, 5 Drawing Sheets

US 6,538,584 B2

TRANSITION REDUCTION ENCODER USING CURRENT AND LAST BIT SETS

BACKGROUND OF THE INVENTION

1. Technical Field of the Invention

The present invention relates to circuits and, more particularly, to sending encoded bits over interconnects.

2. Background Art

Interconnects are used to transmit signals (such as bits) over relatively long distances either inside an integrated circuit (also called a chip) and between integrated circuits.

FIG. 1 illustrates a system 10 of integrated circuits including integrated circuits IC0, IC1, IC2 . . . ICn. The integrated circuits are connected through a bus 14. Integrated circuit IC0 could be a controller for the other integrated circuits or could be the same as other integrated circuits. System 10 may be a system that is referred to as multi-drop system in which one or more of integrated circuits IC1, IC2 . . . ICn are selectively joined to bus 14. System 10, however, is not limited to a multi-drop arrangement. System 10 may be a memory system in which IC0 is a memory controller (either joined with a processor on chip or in a different chip from the processor) and in which integrated circuits IC1, IC2 . . . ICn are, for example, dynamic random access memory (DRAM) chips that are on one or more PCBs. System 10 could also involve a multi-processor system.

Address, data, and control bits on bus 14 may be on separate conductors of bus 14 or they may be, for example, time division multiplexed or packetized. For example, bus 14 may include some conductors used to carry only address bits, some conductors used only to carry only control bits, and some conductors used to carry only data bits. Or, some conductors may be used to transmit some combination of address, control, and/or data bits at different times or through a packetized or arrangement.

FIG. 2 illustrates a system 20 including integrated circuits IC0, IC1, IC2 . . . ICn. The integrated circuits are connected through busses 24-1, 24-2, . . . 24-n and an optional conductor 28. Note that IC0 may be a controller of the other integrated circuits or could be the same as other integrated circuits. System 20 is of the type that is sometimes referred to as point-to-point bus system. System 10, by contrast, is referred to as a radial bus system.

Bidirectional signaling refers to using the same conductors to transmit signals in both directions. For example, data may be transmitted either to or from an integrated circuit. If the same conductor is used in both directions, the signaling is bi-directional. The bi-directional signaling may be sequential or simultaneous. In the case of sequential bi-directional signaling, enable signals may be used to, for example, tri-state or turnoff unused drivers or receivers. In the case of simultaneous bi-directional signaling, the threshold voltage of the receiver may be changed depending on the state of the adjacent driver. For example, if the adjacent driver is transmitting a 0, the receiver threshold may be set to Vcc/4. If the remote driver is also 0, the threshold will not be met. If the remote driver is a 1, the Vcc/4 threshold will be met. If the adjacent driver is transmitting a 1, the receiver threshold may be set to 3 Vcc/4. If the remote driver transmits a 1, the threshold will be met and if it transmits a 0, the threshold will not be met.

BRIEF DESCRIPTION OF THE DRAWINGS

The invention will be understood more fully from the detailed description given below and from the accompanying drawings of embodiments of the invention which, however, should not be taken to limit the invention to the specific embodiments described, but are for explanation and understanding only.

DETAILED DESCRIPTION

The present involves encoding bits on interconnects through considering a previous set of bits (called the last bit set). The interconnects may be between integrated circuits (interchip) or inside an integrated circuit (intrachip).

Figure 3:
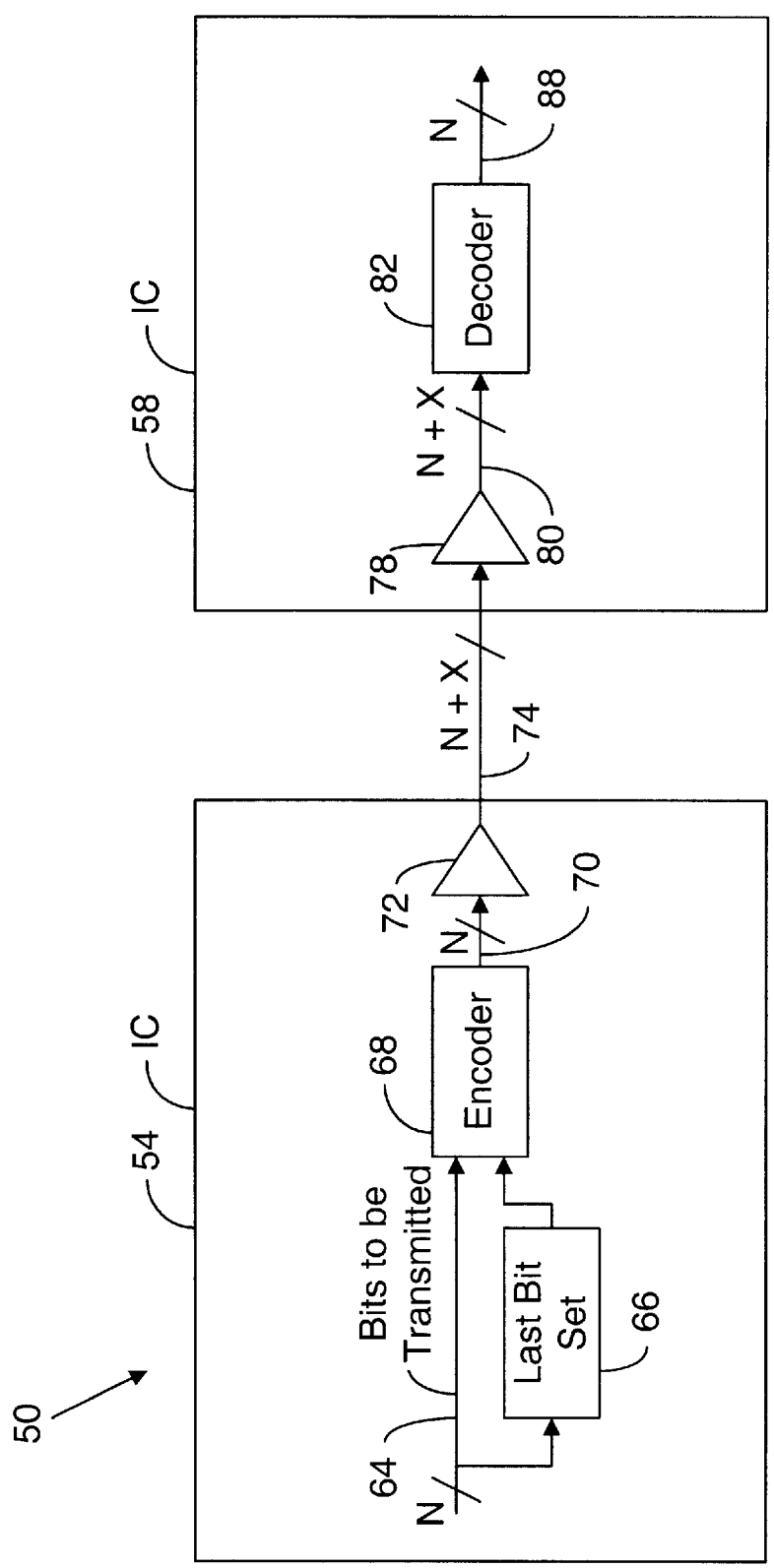
FIG. 3 is a block diagram representation of a system according to some embodiments of the present invention.

FIG. 3 illustrates a system 50 including an integrated circuit 54 and an integrated circuit 58 and interchip interconnect conductors 74. Alternatively, box 54 could represent a subsystem within an integrated and box 58 could represent another subsystem within the same integrated circuit. In that case, interconnect conductors 74 would be an intrachip interconnect conductors.

Integrated circuit 54 includes conductors 64 that are received by a last bit set circuit 66 and an encoder 68. There are N parallel conductors in conductors 64. Bits are transmitted in sets. Last bit set circuit 66 holds the last set of bits (last bit set). Accordingly, encoder 68 considers both the current set of bits on conductors 64 and the last set of bits in determining what to transmit through drivers 72 to interconnect conductors 74. Conductors 74 include N+X conductors. Note that N is the same as the number of conductors 64. X is a number of an additional conductor (when X=1) or conductors (when X>1). For example, X may be 1, 2, or more. There are N+X drivers 72.

The reason for doing the encoding is as follows. Consider the worst case in which the signal on each conductor on conductors 64 changes from 0 (low voltage) to 1 (high voltage). In that case, a large amount of noise is created on the power grid of the chip. In the present invention, values of bits are changed to reduce the number of bits changing states (low to high or high to low). The receiving circuitry may include a decoder to receive the signals from conductors 74 and restore the original signal.

Integrated circuit 58 includes N+X receivers 78, one for each conductor of conductors 74. The signals from the receivers 78 are provided to a decoder 82. The output of decoder 82 is provided to conductors 88. There are N conductors of conductors 88. In some embodiments of the invention, the value of the bits on conductors 88 is the same as those on conductors 64 (but of course, they are shifted in time so the same data is on conductors 88 at a later time than they are on conductors 64).

Figure 4:
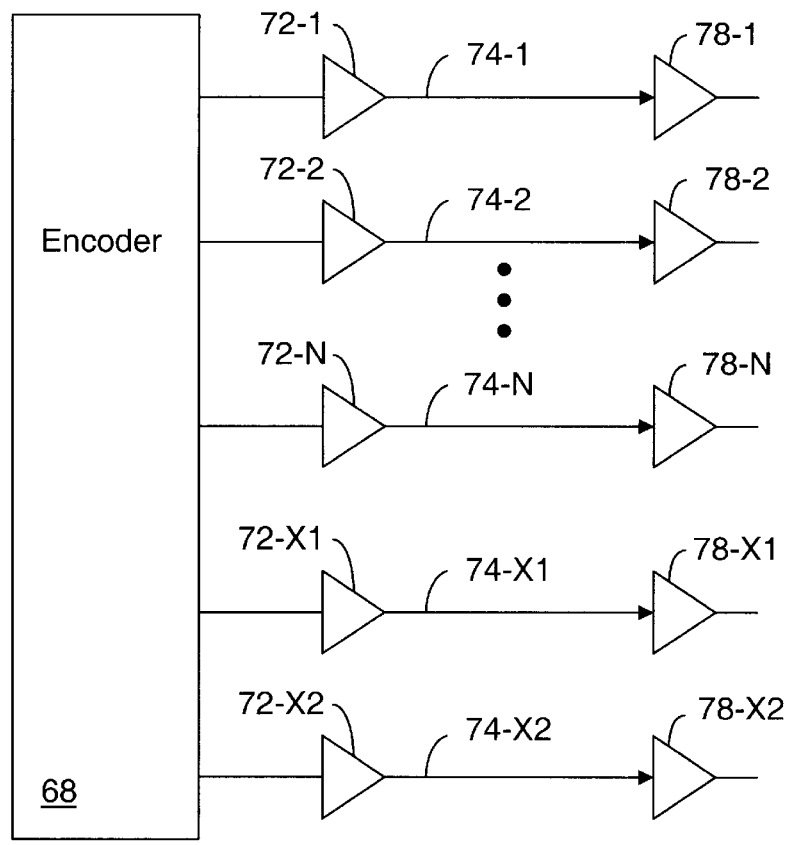
FIG. 4 is a block diagram representation of additional detail of some embodiments of the system of FIG. 3.

FIG. 4 illustrates how there are N+X drivers 72, N+X conductors 74, and N+X receivers 78. Specifically, drivers 72-1, 72-2, . . . 72-N are the N drivers and drivers 72-X1 and 72-X2 are the X drivers. Conductors 74-1, 74-2, . . . 74-N are the N conductors and conductors 74-X1 and 74-X2 are the X conductors. The same applies to receivers 78 as is shown. In FIG. 4, two X drivers, conductors, and receivers are shown. However, in other embodiments there is only one X driver, conductor and receiver. In other embodiments, there are more than two X drivers, conductors and receivers.

Figure 5:
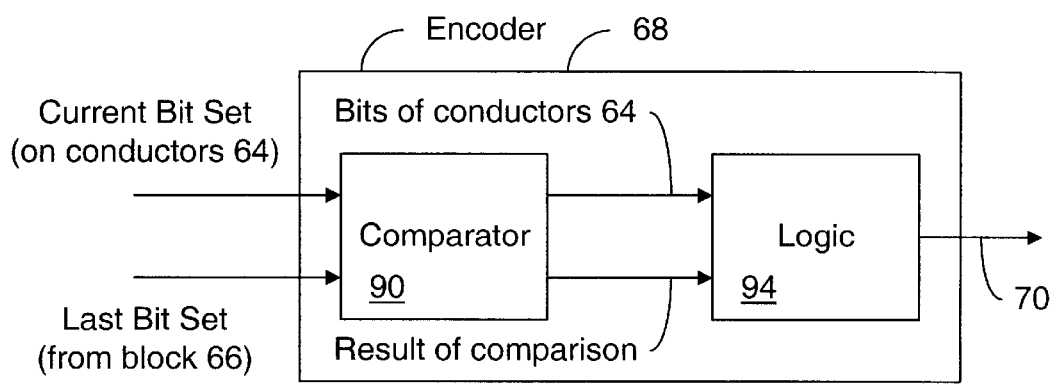
FIG. 5 is a block diagram representation of additional detail of some embodiments of the system of FIG. 3.

FIG. 5 illustrates details of some embodiments of encoder 68, but the invention is not limited to this arrangement. The bits on conductors 64 (called the current bit set) are compared by comparator 90 with the bits from last bit set circuitry 66 (the last bit set). The bits of conductor 64 and the result of the comparison are provided to logic 94 which determines the bits to output on conductors 70. A variety of different rules could be used. The following are some examples. However, the invention is not limited to these examples.

In some embodiments, the bits are inverted if the complement would result in a smaller number of changes than would the original. An X bit indicates whether an inversion has been made, so that on the receiving end the bits can be inverted again to restore the original values.

Consider the following example in which N=8 and X=1. (Of course, in other embodiments, N may be higher than 8 or lower than 8.) The following table illustrates successive bit sets.

TABLE 1

(State of bits on conductors 64 at times t0, t1, and t2 and complements)

| | Current bit set at time t0 and last bit set at time t1 | Current bit set at time t1 and last bit set at time t2 | Complement of current bit set at time t1 | Current bit set at time t2 and last bit set at time t3 | Complement of current bit set at time t2 |
|---|---|---|---|---|---|
| Bit 0 | 0 | 1 | 0 | 1 | 0 |
| Bit 1 | 0 | 0 | 1 | 1 | 0 |
| Bit 2 | 1 | 0 | 1 | 0 | 1 |
| Bit 3 | 1 | 1 | 0 | 0 | 1 |
| Bit 4 | 0 | 1 | 0 | 1 | 0 |
| Bit 5 | 0 | 1 | 0 | 1 | 0 |
| Bit 6 | 1 | 0 | 1 | 0 | 1 |
| Bit 7 | 0 | 0 | 1 | 0 | 1 |

As noted, the bits on conductors 64 at time t0 become the last bit set in last bit set circuitry 66 at time t1. The bits currently on conductors 64 are the current bit set. If there is no encoding, there are 5 transitions between the last bit set of time t1 and the current bit set at time t1. However, there are only 3 transitions between the last bit set of time t1 and the complement of the current bit set at time t1. Accordingly, under the rule, the complementary encoding and corresponding X bits would be provided by encoder 68 to drivers 72. A single X bit can indicate this. Merely as an example, a low (0) X bit may indicate the current bit set will not be inverted by encoder 68 and a high (1) X bit may indicate the current bit set will be inverted by encoder 68. (Of course, the meaning of low and high on the X bit could be reversed.)

There are 2 transitions between the last bit set at time t2 and the current bit set at time t2. However, there are 6 transitions between the last bit set at time t2 and the complement of the current bit set at time t2. Accordingly, under this rule, the complementary encoding is not used. The single bit X can be used as described above.

Where there are the same number of transitions whether or not the bits are inverted, then a rule could be to not invert them.

In embodiments in which there are two or more X bits, one X bit could indicate whether one group of the N bits are being complemented and another X bit could indicate whether another group of the N bits are being complemented. For example, the X1 bit could indicated whether one group of N/2 bits are being complemented and the X2 bit could indicate whether another group of N/2 bits are being complemented. As mentioned, N and X are not restricted to any particular numbers. In some embodiments, driver 72-X2, conductor 74-X2 and receiver 78-X2 are not included.

Figure 6:
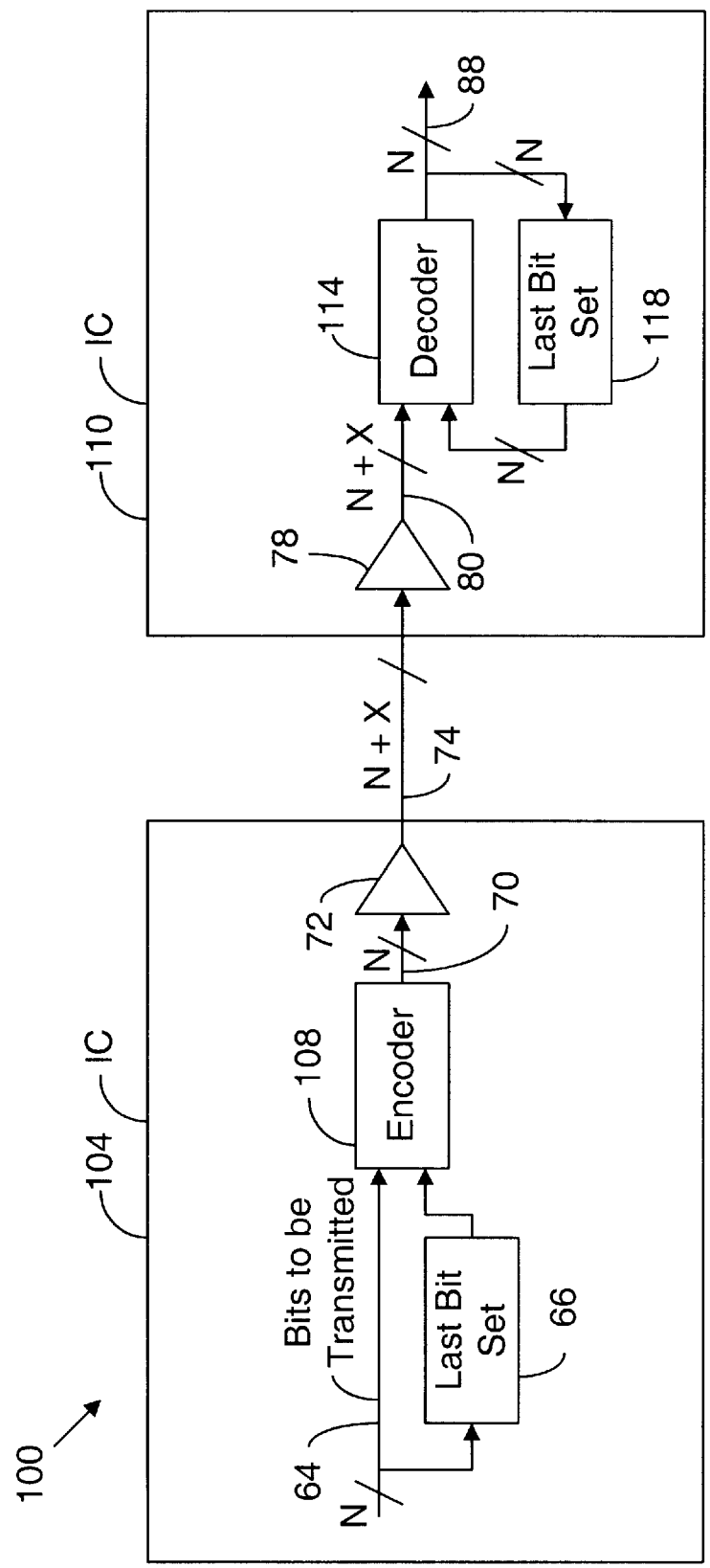
FIG. 6 is a block diagram representation of alternative embodiments of the invention as compared to those of FIG. 3.

The invention is not limited to encoding merely based on whether or not one or more portions of the current bit set is complemented by encoder 68. There may be various other encodings. Some of these encodings may require knowledge of the last bit set to decode. Referring to FIG. 6, a system 100 includes integrated circuits 104 and 110. Transmitting integrated circuit 104 includes an encoder 108 which provides an encoding. Receiving integrated circuit 110 includes an decoding circuitry 114 which uses the last bit set from last bit set circuitry 118.

As mentioned above, the X bit is either high or low. However, in other embodiments, the drivers and receivers for the X bits may have more than one voltage, so that more information is encoded. For example, in some embodiments, if driver 72-X1 could output four voltages so that only one X bit is used rather than two. Driver 72-X1 could output three or more voltages so that additional information other than merely complements could be indicated.

Cross talk is a phenomenon experienced when adjacent bits switch with respect to each other. The encoding could try to reduce cross talk, but that goal is not required in all embodiments of the invention.

Drivers 72 may provide a full swing or low (reduced) swing signal.

Some embodiments of the invention may employ bi-directional signaling. The bi-directional signaling may be sequential or simultaneous. For example, referring to FIG. 7, an encoder 124 and drivers 128 are in integrated circuit 58 and receivers 132 and decoder 134 are in integrated circuit 54. Encoder 124 may be the same as or different than encoder 68. Decoder 134 may be the same as or different than decoder 82. In the case of simultaneous bi-directional signaling, the receivers (e.g., one of receivers 132) can determine the voltage of the remote driver (e.g., one of drivers 128) through considering the voltage being received and the voltage transmitted by the adjacent driver (e.g., one of drivers 72). As mentioned above, the threshold of the receiver can be changed depending on the voltage being transmitted by the adjacent driver.

Figure 1:
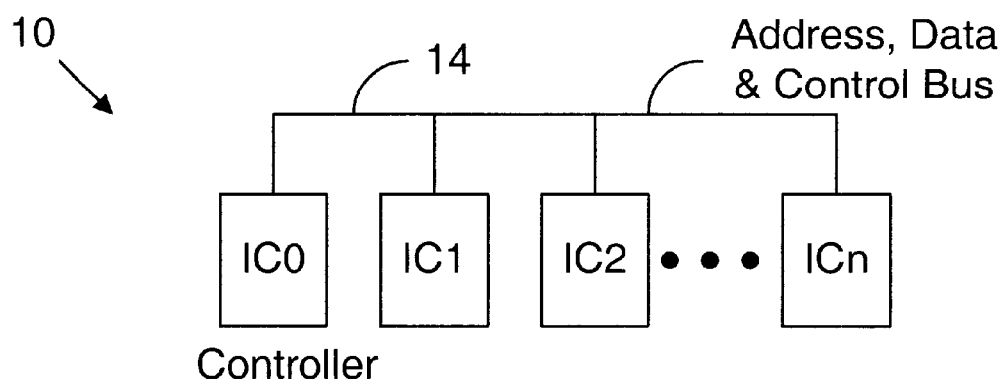
FIG. 1 is a block diagram representation of a prior art system having multiple integrated circuits in a radial arrangement.
Figure 2:
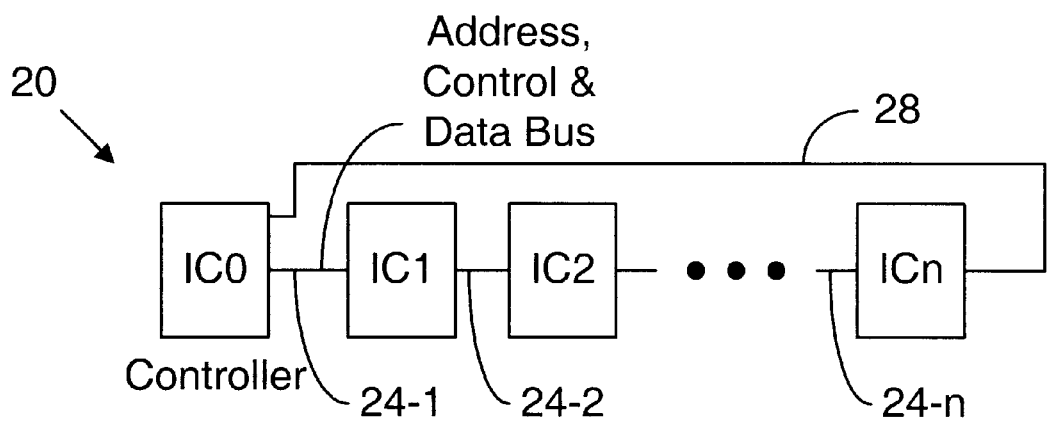
FIG. 2 is a block diagram representation of a prior art system having multiple integrated circuits in a point-to-point arrangement.
Figure 7:
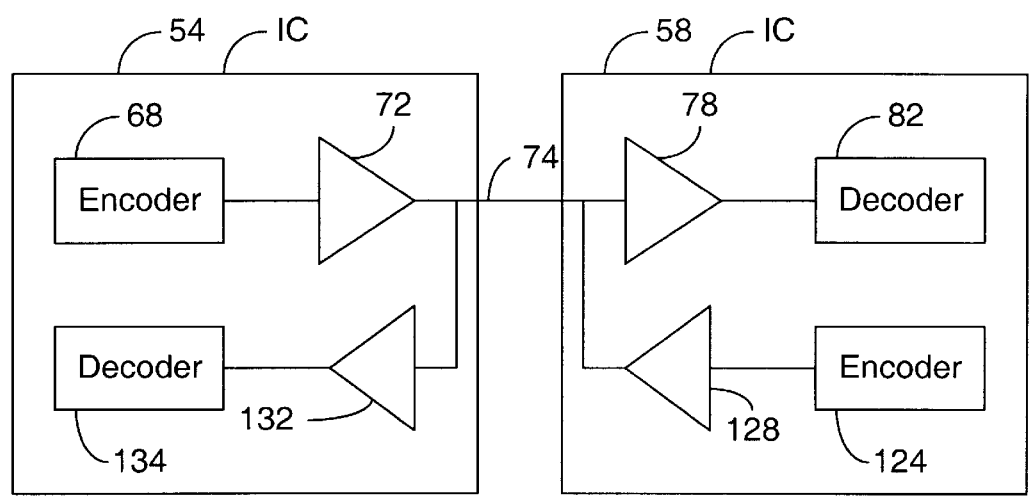
FIG. 7 is a block diagram representation of additional detail in some embodiments of the systems of FIGS. 3 and 6.

The integrated circuits of FIGS. 3, 6, and 7 may be used in a system like that of FIG. 1 or FIG. 2, a hybrid of FIGS. 1 and 2, or in a different system. A different system could have only two integrated circuits (as is shown in FIGS. 3, 6, and 7) in a group rather than more than two as shown in FIGS. 1 and 2. Conductors 74 may carry only data bits, only address bits, only control bits or some combination of them. The invention may be used in connection with a wide variety of integrated circuits including but not limited those involving processors, chipsets, video, and memory.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the invention. The various appearances "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Those skilled in the art having the benefit of this disclosure will appreciate that many other variations from the foregoing description and drawings may be made within the scope of the present invention. Accordingly, it is the following claims including any amendments thereto that define the scope of the invention.

What is claimed is:

1. A circuit comprising:
   a first set of conductors to carry a current bit set;
   last bit set circuitry to hold and provide a last bit set;
   drivers coupled to interconnect conductors to provide signals from the drivers to the interconnect conductors; and
   an encoder to receive the last bit set and the current bit set and determine whether to provide the current bit set or an encoded version of the current bit set to the drivers.

2. The circuit of claim 1, wherein the first set of conductors includes N parallel conductors and the interconnect conductors includes N+X parallel conductors, wherein there is at least one X conductor.

3. The circuit of claim 2, wherein X=1.

4. The circuit of claim 2, wherein N=16 and X=2.

5. The circuit of claim 2, wherein there are N+X drivers.

6. The circuit of claim 2, wherein the at least one X conductor provides information regarding encoding of the current bit set.

7. The circuit of claim 1, wherein:
   the first set of conductors include first and second groups of conductors;
   a first one of the X conductors provides information about an encoding of the first group of conductors; and
   a second one of the X conductors provides information about an encoding of the second group of conductors.

8. The circuit of claim 1, wherein the encoder includes a comparator to compare the last bit set and the current bit set.

9. The circuit of claim 7 wherein the encoder computes the complement of the current bit set and compares it with the last bit set, and if the current bit set would result in a larger number of state transitions than would the complement of the current bit set, then the encoder provides the complement of the current bit set to the drivers.

10. The circuit of claim 1, wherein the interconnect conductors are external to a chip containing the encoder.

11. The circuit of claim 1, wherein the interconnect conductors are internal to a chip containing the encoder.

12. A system comprising:
    a first set of conductors to carry a current bit set;
    last bit set circuitry to hold and provide a last bit set;
    drivers coupled to interconnect conductors to provide signals from the drivers to the interconnect conductors;
    an encoder to receive the last bit set and the current bit set and determine whether to apply the current bit set or an encoded version of the current bit set to the drivers;
    a decoder; and
    receivers coupled to the interconnect conductors to provide the signals on the interconnect conductors to the decoder that undoes an encoding provided by the encoder.

13. The circuit of claim 12, wherein the first set of conductors includes N parallel conductors and the interconnect conductors includes N+X parallel conductors, wherein there is at least one X conductor.

14. The circuit of claim 13, wherein the at least one X conductor provides information regarding encoding of the current bit set.

15. The circuit of claim 12, wherein the encoder includes a comparator to compare the last bit set and the current bit set.

16. The circuit of claim 15 wherein the encoder computes the complement of the current bit set and compares it with the last bit set, and if the current bit set would result in a larger number of state transitions than would the complement of the current bit set, then the encoder provides the complement of the current bit set to the drivers.

17. The circuit of claim 12, wherein the encoder and decoder are on different integrated circuits.

18. The circuit of claim 12, wherein the encoder and decoder are on the same integrated circuit.

19. The circuit of claim 12, wherein the decoder also receives a last bit set from second last bit set circuitry.

20. A system comprising:
    a first circuit comprising:
       (1) a first set of conductors to carry a current bit set;
       (2) last bit set circuitry to hold and provide a last bit set;
       (3) drivers coupled to interconnect conductors to provide signals from the drivers to the interconnect conductors; and
       (4) an encoder to receive the last bit set and the current bit set and determine whether to apply the current bit set or an encoded version of the current bit set to the drivers; and
    a second circuit comprising:
       (1) a decoder; and
       (2) receivers coupled to the interconnect conductors to provide the signals on the interconnect conductors to the decoder that undoes an encoding provided by the encoder.

21. The system of claim 20, wherein the first circuit is on a first integrated circuit and the second circuit is on a second integrated circuit.

22. The system of claim 20, wherein the decoder also receives a last bit set from second last bit set circuitry.

* * * * *